United States Patent [19]

Brokaw et al.

[11] 4,400,690

[45] Aug. 23, 1983

[54] A-TO-D CONVERTER OF THE SUCCESSIVE-APPROXIMATION TYPE

[75] Inventors: Adrian P. Brokaw, Burlington; Modesto A. Maidique, Lexington, both of Mass.

[73] Assignee: Analog Devices, Incorporated, Norwood, Mass.

[21] Appl. No.: 67,992

[22] Filed: Aug. 20, 1979

Related U.S. Application Data

[60] Division of Ser. No. 931,960, Aug. 8, 1978, which is a continuation-in-part of Ser. No. 785,322, Apr. 7, 1977, abandoned.

[51] Int. Cl.³ .................... H03K 13/02; H03K 13/08
[52] U.S. Cl. .................... 340/347 AD; 340/347 DA; 340/347 M
[58] Field of Search ............... 340/347 AD, 347 DA; 357/92

[56] References Cited

U.S. PATENT DOCUMENTS

| | | | |
|---|---|---|---|
| 3,916,218 | 10/1975 | Berger et al. | 307/213 |
| 3,961,326 | 6/1976 | Craven | 340/347 DA |
| 3,965,666 | 6/1976 | Williams | 307/297 X |
| 4,007,385 | 2/1977 | Chapron | 357/92 X |
| 4,009,397 | 2/1977 | Mulder et al. | 357/92 X |
| 4,013,901 | 3/1977 | Williams | 357/92 X |
| 4,158,782 | 6/1979 | Price, Jr. | 307/203 X |
| 4,178,584 | 12/1979 | Davis | 340/347 DA |
| 4,227,185 | 10/1980 | Kronlage | 340/347 NT |

OTHER PUBLICATIONS

The Engineering Staff of Analog Devices, Inc, Analog-Digital Conversion Handbook, 6/1972, pp. I-55 to I-59.

Dooley, A Complete Monolithic 10-Bit D/A Converter, 1973 IEEE International Solid-State Circuits Conference, Digest of Technical Papers 14, Feb. 1973, pp. 12-14.

The Engineering Staff of Analog Devics, Inc., Analog-Digital Conversion Handbook, 6/1972, pp. II-46 to II-48.

Hart et al., Bipolar LSI Takes a New Direction with Integrated Injection Logic, Electronics, 3 Oct. 1974, pp. 111-118.

*Primary Examiner*—T. J. Sloyan
*Attorney, Agent, or Firm*—Parmelee, Bollinger & Bramblett

[57] ABSTRACT

An integrated-circuit analog-to-digital converter of the successive-approximation type formed on a single monolithic chip. The converter is made by a diffusion process wherein certain portions of the chip are formed with normal-mode linear transistors, and other portions are formed with inverted mode I²L transistors. The normal-mode transistors provide a switchable current-source DAC, a set of three-state output buffers, and a comparator. The inverted mode transistors provide an internal clock and successive-approximation control circuitry for the DAC. The chip also includes a voltage reference to provide for absolute analog-to-digital conversions

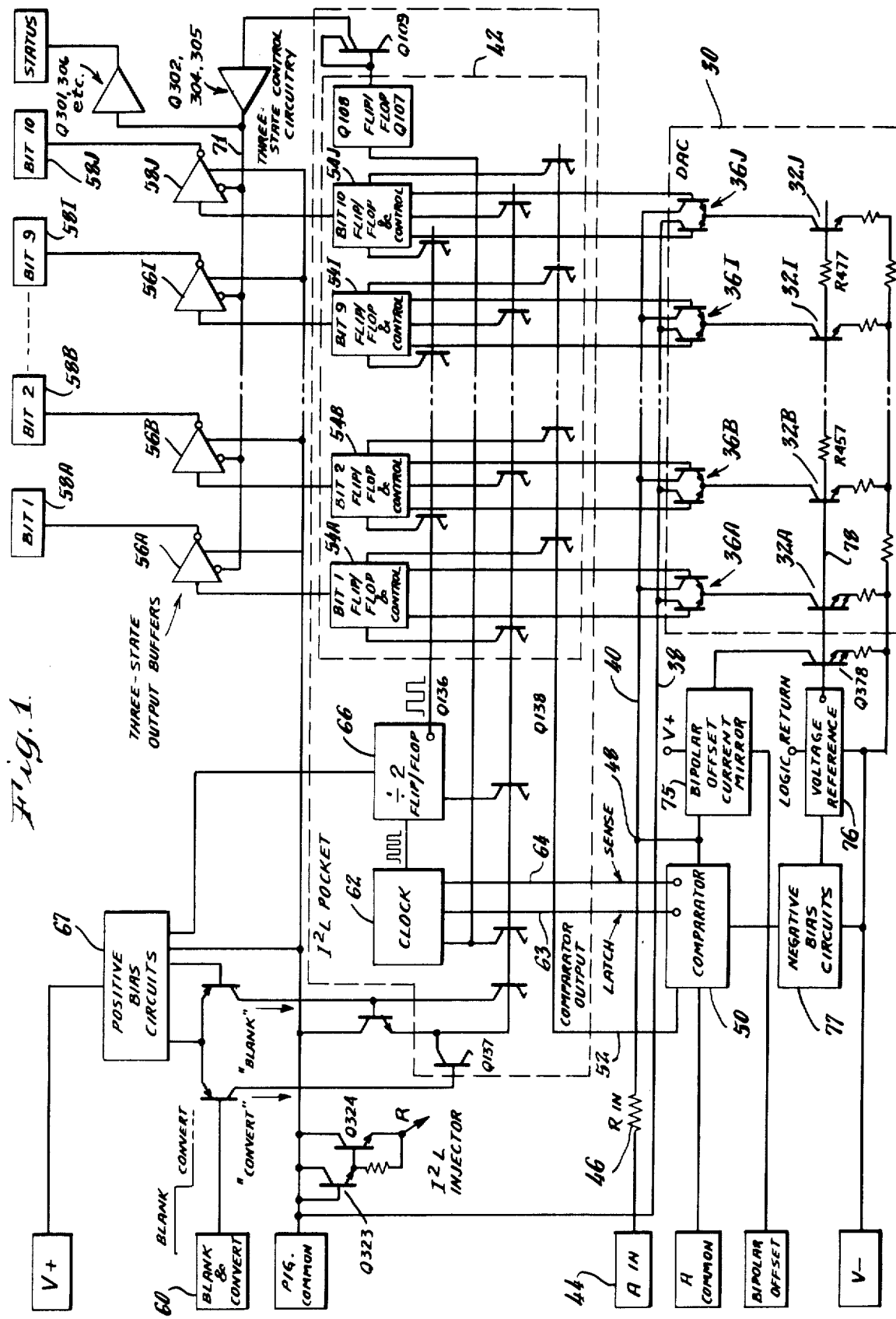

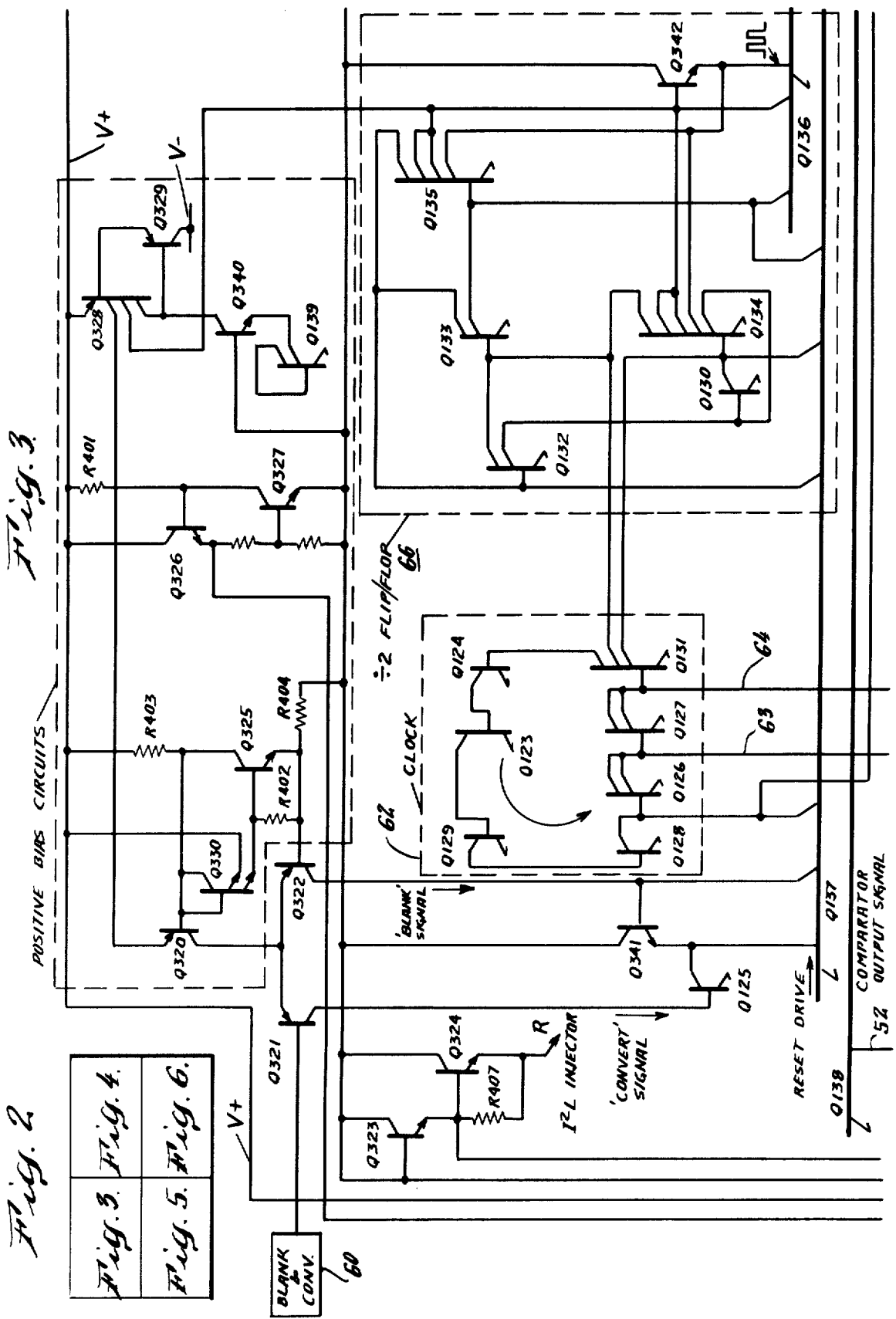

A-TO-D CONVERTER OF THE SUCCESSIVE-APPROXIMATION TYPE

This is a division of application Ser. No. 931,960 Filed Aug. 8, 1978 which in turn is a Continuation-in-Part of Ser. No. 785,322 filed Apr. 7, 1977, now abandoned.

BACKGROUND OF THE INVENTION

1. Field of the Invention

This invention relates to analog-to-digital converters adapted to receive an electrical analog input signal and to produce a corresponding electrical digital output signal. More particularly, this invention relates to a successive-approximation A/D converter constructed in integrated circuit (IC) form.

2. Description of the Prior Art

Analog-to-digital converters of various types have been in use for many years, typically employed for converting analog measurements and the like into corresponding digital signals for processing by high-speed digital computers. For certain applications, there has been considerable use of converters incorporating electronic ramp-signal integrators with clock-pulse timing devices for producing a digital count corresponding to the magnitude of an analog signal. A converter of the latter type having important advantageous features is disclosed in U.S. Pat. No. 3,872,466 issued to Ivar Wold on Mar. 18, 1975.

For other applications, there has been widespread use of so-called successive-approximation converters. Such converters include a digital-to-analog converter (often called a DAC) which during the conversion cycle is sequenced through a predetermined algorithm whereby the DAC output at appropriate stages is compared with the analog input signal to determine whether a corresponding bit of the final digital output signal should be "high" or "low". The results of this determination are used to set the respective stages of the successive-approximation register (SAR). The nature of such operation is in general well known, and is described for example at Page II-81 of the "A D Conversion Handbook" published by Analog Devices, Inc. of Norwood, Mass. Still further information on various converters may be found in the book "Electronic Analog/Digital Conversions" by H. A. Schmid (Van Nostrand Reinhold, 1970).

Among the important requirements for interface devices such as analog-to-digital converters is that they be small in size and economical to manufacture. Although such an objective has been suitably realized in a-to-d converters of the ramp-signal integrator type by constructing the converter as an integrated circuit on one or two monolithic chips, there has been no comparable advance achieved in the development of successive-approximation converters. In part, this has been due to the difficulty of using conventional processing technology to place on one or two chips a complete DAC together with all of the circuitry required for the successive approximation functions for controlling the DAC and storing the results of the successive analog comparisons.

SUMMARY OF THE INVENTION

In accordance with an important aspect of the present invention, a superior IC analog-to-digital converter of the successive-approximation type is provided by diffusing the substrate in such a way as to produce a composite of normal mode transistors and inverted mode transistors, i.e. I$^2$L (integrated injection logic) transistors for carrying out the analog-to-digital conversion operations. By such composite construction, as will be described in detail hereinbelow, it becomes possible to place on a single relatively small monolithic chip all of the circuit elements needed for a complete successive-approximation converter. This represents a significant step forward, particularly since efforts to combine ordinary bipolar linear circuits with logic using the linear parts in conventional format have produced configurations which are prohibitively large. However, it has been found that in accordance with the present invention the entire converter function can be carried out by elements occupying only a relatively small area, and which can be manufactured using processes very similar to conventional diffusion processes.

For further information on I$^2$L processes and techniques, reference may be made to "Design Considerations for Merged Transistor Logic (Integrated Injection Logic)" by Horst H. Berger, pps. 14–15 of the Digest of the 1974 IEEE International Solid State Circuits Conference. There are numerous other publications providing additional information on this subject.

Accordingly, it is an object of this invention to provide a significantly improved analog-to-digital converter of the successive-approximation type. Still other objects, aspects and advantages of the invention will in part be pointed out in, and in part apparent from, the following detailed description considered together with the accompanying drawings.

BRIEF DESCRIPTION OF THE DRAWINGS

FIG. 1 is a schematic diagram, partly in block format, showing one embodiment of the present invention comprising a complete analog-to-digital converter formed on a single monolithic chip;

FIG. 2 shows diagrammatically the positional relationship for combining FIGS. 3 through 6;

FIGS. 3 through 6 together present a detailed schematic of the embodiment of FIG. 1;

DETAILED DESCRIPTION OF A PREFERRED EMBODIMENT

Figure 4:
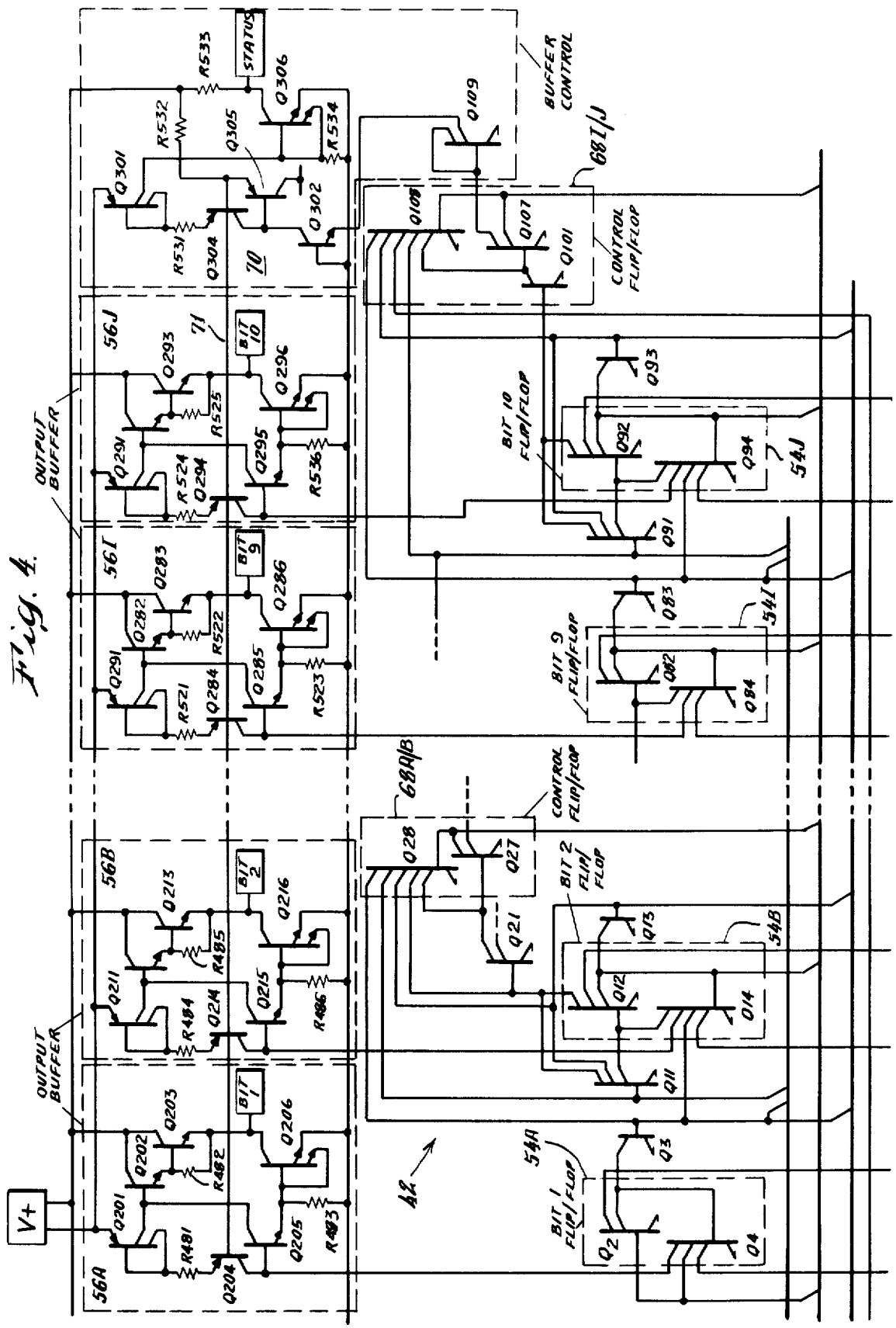

A presently preferred analog-to-digital converter in accordance with this invention comprises a single substrate which is subjected to a multi-step diffusion process to form a monolithic chip having in certain regions thereof, inverted mode I$^2$L transistors. FIG. 1 shows this embodiment diagrammatically. In this Figure, and also in FIGS. 3–6, the inverted mode transistors are located in an I$^2$L "pocket" portion of the substrate, indicated by a dashed-line block, and the individual transistors thereof are signified by emitters with a half-arrowhead; all of these emitters have a common connection to the logic return. The I$^2$L injection rail R is shown as a so-labelled, filled-in arrowhead. The remaining portions of the chip comprise (with one minor exception) normal-mode transistors which are therefore not specially identified symbolically.

The composite chip in accordance with the invention is made by a diffusion process having only one more step than the standard process, that of diffusing a deep n+ to prevent cross-talk between adjacent gates in the structure. The process produces all of the standard components in addition to I²L transistors. This can be achieved in an essentially standard process because in making the I²L gate device (1) the normal emitter diffusion forms the I²L collectors, (2) the bases are the same and are formed simultaneously, and (3) the epitaxial region normally used for the collector serves as the I²L emitter. Since each multi-collector I²L transistor is a self-contained logic gate, the packing density can be substantially improved.

Referring now to the lower right-hand corner of FIG. 1, the chip includes a 10-bit current-output DAC 30 (shown within an interrupted line block) and comprising a plurality of normal-mode transistor current sources 32A, 32B, etc. The currents produced by these sources are binarily weighted by means of a resistive network 34 connected to the emitters of the transistors. Each current source is controlled by a respective switch 36A, 36B, etc., comprising a differential pair of transistors arranged to divert the source current either to a digital common line 38 or to a current summing line 40, in accordance with the state of the control signals supplied to the bases of the differential pair switches. A DAC of the type shown herein is described in detail in U.S. Pat. No. 3,940,760, issued to A. P. Brokaw on Feb. 24, 1976.

The switches 36A, etc., of the DAC 30 are operated by a successive-approximation control means, generally indicated at 42, which carries out a conventional successive-approximation algorithm such as is well known in the art of analog-to-digital converters. During execution of this algorithm, DAC output currents on line 40 are compared to the analog input signal which is fed through the analog input terminal 44 and an input resistor 46 to a summing point 48 which is connected to a comparator 50. The results of the comparison are directed through a line 52 to the successive-approximation control means 42 to determine the state of the individual bit flip-flops 54A, etc., forming part thereof.

In brief, the DAC 30 is controlled by the successive-approximation control means 42 in such a way that the most significant bit (MSB) source 36A first is turned on, and its value is compared to the input analog signal. If the analog input is larger, the Bit 1 flip-flop 54A is set, and the MSB current source is maintained on by the associated control circuitry. Thereafter, the next current source 32B is turned on (having half the value of the MSB current), and another comparison is made between the analog input signal and the combined currents of the first two current sources 32A, 32B. If the analog input signal is greater, the Bit 2 flip-flop 54B is set, and the current source 32B is thereafter maintained in its on state by the associated control circuitry. If the analog input is smaller, the Bit 2 flip-flop is placed in reset state, and the current source 32B is turned off. This procedure continues in the well known manner until all current sources have been tested and compared with the analog input signal. The final state of the flip-flops 54A, etc., represents the digital number corresponding to the analog input signal. These flip-flops are connected to respective three-state output buffers 56A, etc., which are activated at the end of the conversion cycle so as to produce a digital output signal on the bit output terminals 58A. etc.

A conversion cycle is initiated by applying a start signal to the "Blank & Convert" terminal 60. This start signal first goes high to produce the "blank" function, wherein the converter circuitry is reset to an initial condition, and therafter goes low, to begin the successive-approximation conversion sequence.

Referring now to FIG. 3 as well as to FIG. 1, in the "blank" mode with B&C high (above the threshold level at the base of Q322), current from Q320 is conveyed by Q322 to the base of Q341. This current drives Q341 on which in turn drives on Q137. (Schematically, Q137 is shown in FIG. 3 as a single, multiple-collector transistor; in the actual chip, it is composed of a number of one and two collector transistors which are connected in parallel so as to act like a multiple-collector device responding to the drive signal from Q341.)

As Q137 comes on, it begins to steal the base drive from Q341 by way of one of its collectors returned to the Q341 base. Q341 is a normal mode transistor with relatively high $\beta$ so that it requires only a small base current in order to deliver enough drive to turn on Q137. As Q137 comes on, an equilibrium is reached wherein the collector current of Q137 rises to equal the collector current of Q322, less only the small base current of Q341. Bias circuits, consisting of Q139 (a current limiter), Q340, Q329 and Q328 establish this current at a level which is somewhat greater than the base current of any injected transistor in the I²L array. As a result, Q137 is turned on with sufficient drive to insure that its collectors can sink the base current of any transistor in the array.

(Note: To simplify FIG. 4, only the circuitry for the first two and the last two bits is shown. The output buffers and the DAC current sources for the other six bits are identical to those shown. To complete the presentation, FIG. 7 has been included to show the details of the control circuitry for the other six bits.)

One collector of Q137 drives the base of Q126 and thereby presets the condition of a clock 62 the operation of which will be described hereinbelow. Referring also to FIG. 4, the other collectors of Q137 drive points in the successive-approximation control logic 42 to establish the initial conditions of all of the bit flip-flops 54A, etc.

After all of the converter circuits have been cleared to initial condition, the B&C input will be driven low. This causes the current from Q320 to be diverted from Q322 to Q321 which drives the base of Q125. Lacking base drive, Q341 switches off and the collector of Q125 speeds the turn-off of Q137. When Q137 is off, its collectors release the successive-approximation control logic and also release the clamp on Q126 in the clock to initiate a conversion.

The internal clock 62 is a ring oscillator consisting of Q123, Q124, Q126–Q129 and Q131. Since the ring has an odd number of transistors (7), it is unstable, and oscillates at a frequency determined by the logic signal propagation times. This arrangement minimizes problems due to processing-related variations in propagation delay since the clock speed changes with the inherent logic speed.

The main clock loop drives two functions. One provides the comparator latch/sense signals on lines 63, 64; the other operates a divide-by-two flip-flop 66 the output of which drives the successive-approximation control and register 42 (hereinafter the "SAR") through its algorithm. The SAR advances on both rising and falling edges of the clock drive it receives from the flip-flop 66. As a result, the SAR runs at twice the apparent clocking frequency. The divide-by-two flip-flop, composed of Q130, Q132-Q136 and Q342 halves the clock frequency so that the SAR advances one step for each full cycle of the clock 62.

The I²L transistors in this divide-by-two circuit make up a D flip-flop with the $\bar{Q}$ output tied back to the D input. The normal mode transistor Q342 is a buffer which drives the base of Q136. Drive for Q342 is derived from the same bias circuitry 67 as the B&C control current, i.e. transistors Q139, Q340, Q329 and Q328 as shown in FIG. 3. The drive is controlled by Q134 and Q135 which would drive Q136 directly in a conventional D flip-flop. The buffering, supplied by Q342, is needed to drive the multiple collectors of Q136. These collectors control the clocking of the SAR. (As with Q137, the schematic of FIG. 3 shows Q136 as a single multiple-collector device although it is actually a number of individual transistors driven by a common base line.)

Adequate drive is insured by supplying the base of Q342 with somewhat more than the normal I²L gate current derived from the injector rail R. When Q342 drives Q136 on, Q136 must sink more than the normal gate current before reaching equilibrium with the current from Q328. As a result, Q136 is driven hard enough that the other collectors can all sink at least the maximum gate current.

The current from Q328 is limited, however, so that the base voltage of Q342 can be controlled by the double-sized collectors of either Q134 or Q135. These drive transistors also have a collector driving the base of Q136 to remove excess charge when Q342 switches off.

The circuit described provides a clock drive serving all of the SAR 42, and which alternates once each time Q131, in the main clock oscillator, switches off. Use of the D flip-flop 66 to halve the frequency results in a lower transistor count than would be required to achieve the same frequency with a ring oscillator of twice the number of stages. Also, use of frequency division allows the comparator to be latched just before each advance of the SAR. Since the SAR advances on both leading and trailing edges of its clock drive, the comparator must be latched (and unlatched) at twice the SAR clock frequency. The comparator is therefore operated from the ring oscillator loop and the SAR is operated from the ring oscillator frequency divided by two.

In the diffused chip, the bases of Q127 and Q131 are enlarged to partially surround their respective injector region. As a result, they have an excess of base drive, some of which is used to supply the base currents of Q355 and Q356 in the comparator 50. These last two transistors control one of the main bias circuits in the comparator. When Q355 is on, current from Q372 drives the comparator input stage and the comparator operates in a linear mode. If Q356 is switched on and Q355 is switched off, the current from Q372 is bypassed around the input stage and through a flip-flop circuit connected with the comparator, and which latches in the current state of the comparator. Since under that circumstance the input stage is disabled, subsequent changes in the comparator input signal will have no effect and the comparator output will remain latched with the information present at the switching time. The comparator can be restored to linear, or input-sensitive operation, simply by reversing the drive to the control transistors, switching Q356 off and Q355 back on again.

When the B&C signal goes low to "convert" and causes Q137 to release the base of Q126, an inversion begins to propagate around the ring oscillator of clock 62. The base of Q126, which was low, rises and Q126 turns on driving the base of Q127 low. When Q127 goes off, Q131 is allowed to go on, and the inversion continues around the ring. With the base of Q127 held low and the base of Q131 high, the comparator is in the input-sensitive mode and senses the difference between the MSB and the analog input signal.

When the inversion completely circles the ring, Q127 will be switched on and it will, in turn, switch off Q131. These two base signals will cause the comparator to latch the state of its output. As Q131 goes off, two of its collectors trigger the flip-flop 66 and cause it to toggle, advancing the state of the SAR. When the SAR advances, a new test condition is presented to the comparator. However, the results of the previous test will remain latched into the comparator until the appropriate switching is complete. The inversion which triggered the D flip-flop 66 will continue around the ring until it reaches Q127 and Q131 again, whereupon the comparator will be restored to the input-sensitive mode to examine the new test condition, and the flip-flop inputs will be driven low to arm it for the next clock pulse.

Test Sequence of the Successive-Approximation Register

The individual bit current sources 32A, etc. of the DAC 30 are controlled by the flip-flops 54A, etc., in the SAR. Each of these flip-flops consists of a pair of transistors: Q2 and Q4 for the MSB; Q12 and Q14 for the 2nd SB; Q82 and Q84 for bit 9, etc., and in general $Q \times 2$ and $Q \times 4$ for bit $x+1$. Each of the bits is sequentially tested beginning with the MSB and progressing to the LSB. The SAR circuitry repeats on a 2-bit cycle inside the register. The beginning and end (MSB and Status) of the register are modified slightly from the cyclic pattern to accommodate their start and finish functions.

The resetting function of the B&C input, which is implemented by Q137, clears the flip-flops associated with bits 2 through 10 so that these bits are not expressed in the DAC output. The MSB is switched on by a collector of Q137 which drives the base of Q2. When a conversion begins, Q137 is switched off leaving the 10 flip-flops in their cleared state, but capable of being flipped by other signals.

Figure 7:
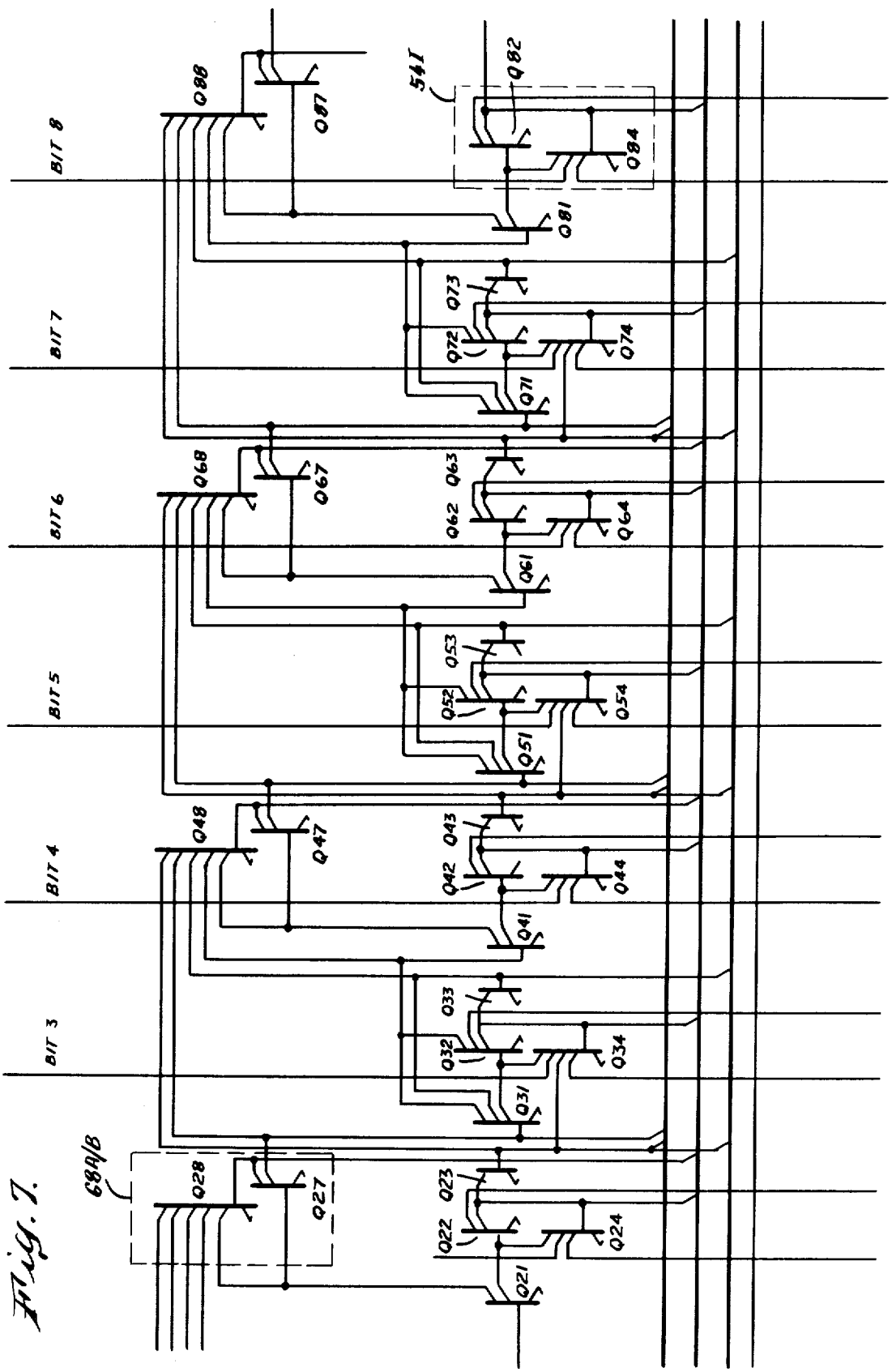
FIG. 7 shows certain details of the successive-approximation register which were omitted from FIG. 4 for the sake of simplicity.

The reset functions of Q137 also clears 5 control flip-flops 68A/B–68I/J, one for each adjacent pair of bit flip-flops 54A, 54B; 54C, 54D; etc., and consisting of pairs of transistors Q27-Q28-Q107-Q108. These flip-flops control the sequence of events in the SAR. In particular, Q27 is on after the reset signal from Q137 and holds off Q31 (FIG. 7). Q51 is held off by Q47 and so forth to Q91 which is held off by Q87. There is no preceding control flip-flop to hold off Q11 (which is similar in function to Q31, Q51, etc.). However, when the convert sequence begins, Q136 is on, holding all SAR clock lines low. During the first clock interval, while the base of Q11 is held low, the Q2-Q4 flip-flop is on alone and the MSB is tested. At the end of the first main clock cycle, the D flip-flop 66 is switched and Q136 goes off allowing Q11 to come on. When Q11 comes on, it switches Q12 off causing the Q12-Q14 flip-flop to toggle. Outputs from Q12 and Q14 switch on the second bit of the DAC 30 by way of Q217 and Q218. During the interval following this transition, the second bit is tested.

In the reset state, Q12 holds Q21 off. When Q11 comes on, switching Q12, Q11 holds Q21 off. At the end of the high clock cycle at the base of Q11, however, Q11 is switched off, Q12 has been previously switched off, and Q21 is allowed to come on. When Q21 comes on, it drives Q27 off thereby toggling the Q27-Q28 flip-flop. Since this flip-flop can be cleared only by the general B&C reset, it will remain set for the remainder of the conversion. Outputs from Q28 now go low blocking any subsequent operation of Q11, Q21, Q3 or Q13. Once Q28 comes on, it insures that the preceding portions of the successive-approximation sequence will not be repeated in this cycle.

When Q21 comes on it also drives Q22 off (FIG. 7) setting the Q22-Q24 flip-flop and initiating the testing of bit 3. This test will continue while the collectors of Q136 remain low.

One additional change during this interval is the enabling of Q31. When Q27 is switched off, it releases the base of Q31 which, however, continues to be held low by a collector of Q136. When this clock cycle ends and the D flip-flop 66 turns off Q136, Q31 will come on setting the Q32-Q34 flip-flop. This situation is analogous to the sequence initiated by the clocking of Q11. Subsequent operations are also analogous. That is, bit 4 is tested while Q136 is off. When Q136 is next switched on, Q41 comes on setting both the Q47-Q48 and the Q42-Q44 flip-flops. Bit 5 will be tested, the preceding circuits will be blocked by Q48, and Q51 will be enabled by Q47. Each succeeding rise and fall of the clock signals from Q136 will advance the test bit by one position until all 10 bits have been tested.

At the end of the test interval for the tenth bit, the collectors of Q108 "jam" preceding sections of the register. Also, one collector of Q108 is returned to the base of Q126 to stop the clock 62 after 10 bits have been converted. One collector of Q107 drives Q109, a controlled $\beta I^2 L$ transistor comprising a half-size current-limiting collector connection to its base. This transistor switches on and draws a current which approaches twice the gate current of a single injected device. This current drives the status buffer 70 by way of Q302.

The status buffer 70 indicates that a conversion is complete, and it also drives, via a line 71, the 10-bit three-state output buffers 56A, etc., into the indicating state. Each of the bit output buffers is driven by a collector from the DAC control flip-flop (Q4, Q14, Q×4) to indicate the final state of the DAC. This state will be within one bit of balancing the input signal (for signals inside the converter's range) and so indicates digitally the magnitude of the analog input.

COMPARATOR CONTROL

The description of the test sequence above shows how each bit of the DAC 30 is switched on as the conversion proceeds. In order for the DAC output to converge on a value approximating the analog signal input, means must be provided to switch off bits which, when summed with previously selected bits, exceed the input signal. The comparator circuit detects the sign of the difference of the analog input and the DAC output. Its output through line 52 drives the base of Q138 with the result of the comparison, and the output is latched on or off by the clock 62 during a particular period of the clock cycle.

When the analog input exceeds the DAC output, Q138 will be driven on; when the DAC output exceeds the analog input Q138 will be driven off. FIG. 3 indicates that Q138 is a single multiple-collector device, but like the clock and reset transistors Q136 and Q137, it is actually composed of a number of transistors driven parallel. Unlike the clock and reset transistors, however, it does not use feedback control of its drive. Instead, the base connection to Q138 is overdriven by the comparator in the on state.

The collectors of Q138 control the transistors Q3, Q13 . . . Q×3 associated with the bit flip-flops 54A, etc. These transistors Q3, etc., are arranged so that they will reset their associated flip-flop at the end of the test interval unless they are inhibited by Q138.

Consider the action of Q3 on the Q2-Q4 flip-flop. During the test of the MSB, the collectors of Q136 are low. One of these collectors drives Q3 and prevents it from resetting Q2-Q4. At this time both Q14 and Q28 are off so that at the end of the MSB test interval when Q136 goes off, Q3 will come on and reset the Q2-Q4 flip-flops unless the collector of Q138 driving Q3 inhibits it.

When the clock transistor Q136 goes off, the previously described sequence where Q11 sets the Q12-Q14 flip-flop begins. Therefore, after three gate delays, Q14 comes on and inhibits Q3 from resetting the Q2-Q4 flip-flop. That is, when the clock collectors go high at the end of the MSB test interval, Q3 is enabled for a period of three gate delays, to reset the Q2-Q4 flip-flop unless it is inhibited by the comparator by way of Q138. Subsequently, when the clock transistor is driven back on, Q14 may be reset. However, Q28 will come on and remain on for the remainder of the conversion to inhibit Q3. Since the clock collectors are low during this change, any underlap between Q14 and Q28 is masked by Q136 at the base of Q3. Therefore, Q3 has only one possible opportunity during the entire conversion to reset the Q2-Q4 flip-flop.

When the collectors of Q136 go high to initiate testing of the second bit, Q11 is driven on setting the Q12-Q14 flip-flop and inhibiting Q13 from resetting it. At the end of the bit 2 test interval, the clock collectors go low switching Q11 off and removing its inhibiting effect on Q13. If Q13 is not inhibited by its drive from the collector of Q138, it will come on and reset the Q12-Q14 flip-flop. When Q11 goes off, enabling Q13, it also initiates the chain of events which drives Q21 on, Q27 off and Q28 on. One collector of Q28 is connected to inhibit Q13 so that Q11 enables Q13, and three gate delays later Q28 disables it again. Since Q28 will remain on for the entire remainder of the conversion, Q13 is enabled to reset the Q12-Q14 flip-flop for only this three-gate delay interval at the end of the second bit test. Depending on the state of Q138, which is controlled by the comparator, the second bit will be retained or rejected at this time.

The function of Q23 in resetting the Q22-Q24 flip-flop is nearly identical to that of Q3 with respect to its flip-flop. During the second bit test interval, Q23 is enabled. However, at that time the Q22-Q24 flip-flop is still in its initial reset state so that Q23 has no effect. At the beginning of the fourth bit test interval, Q23 is enabled by the clock for the three gate delay interval necessary to switch Q34 on. During this enabled time, bit 3 is retained or rejected under control of the comparator. After this time and for the remainder of the convert cycle, Q23 will be inhibited by one or more of Q34, Q48, Q138 or Q136. The operation of Q33 in relation to bit 4 is identical to that of Q13 to bit 2. Each stage of the SAR has a reset transistor Q3, Q13, Q23, Q33, etc., which is enabled for three gate delays at the end of its test interval so that the stage may be reset by the comparator as appropriate.

Q5, Q6; Q15, Q16; Q25, Q26; etc., shown as collectorless I²L transistors on the schematic, are clamped current sources which supply the drive for the DAC current diverters Q207, Q208; Q217, Q218, Q227, Q228; and so on. These transistors Q5, etc., are simply injected I²L gates without collectors. Their unloaded voltage will rise to, approximately, the injector voltage and they can supply a normal I²L gate current to a load. They are driven off, in alternation, by the bit control flip-flops 54A, etc., so as to cause only one of a pair of transistors Q2×7 and Q2×8 to conduct. This arrangement allows the flip-flop to divert the individual bit currents of the DAC to the analog summing point or ground. This method is preferred to direct drive of the current diverters by the flip-flop bases, so as to provide adequate base drive for the high order bits, and to prevent unwanted dynamic interaction between the DAC and the logic.

The circuitry of the comparator 50 provides for fast latching, in part because it includes as an integral element thereof an internal flip-flop controlled directly by the comparator currents. In more detail, the sense comparison is effected primarily by a pair of transistors Q351, Q352 the currents of which pass through load circuits comprising R410, Q347; and R411, Q348. Transistors Q347 and Q348 are provided with additional emitters which, when the clock 62 switches transistor Q356 on, conduct current through that transistor. When switchover occurs, the flow of current activates an internal flip-flop comprising Q345, Q346 which thereupon latches the sensed state of the comparison and fixes the output signal of the comparator at the latched value.

The double-ended output signal from the comparator 50 is directed through respective circuits to a pair of level-shifting Zener diodes 73, 74 diffused into the substrate together with respective transistor Q343, Q344. These transistors form a differential pair the collectors of which are connected to a circuit Q331, Q370 arranged to convert the double-ended comparator signal to a corresponding single-ended signal for the comparator output line 52.

The currents flowing through the comparator 50 and its output circuitry are controlled by conventional negative bias circuits indicated at 77. The summing point 48, at the input to the comparator, also is connected to a bipolar offset current source in the form of a current mirror 75. The current of this source is controlled by a current developed by a transistor Q378 supplied by a voltage supply 76 which applies a supply voltage to a common base line 78. When the current mirror is activated, it supplies to summing point 48 a current equal to one-half the full-scale current, thus providing the required offset effect to achieve bipolar operation. The voltage supply 76 comprises a Zener diode D402 which preferably is diffused to provide a sub-surface breakdown Zener diode, i.e. a so-called buried-layer Zener. The other Zener D401 provides circuit start up.

The transistor base line 78 is connected to the current sources 36A, etc., of the DAC 30, and includes interbase resistors R451, 477, etc., through which is directed a PTAT (proportional-to-abolute-temperature) current in accordance with the teachings of U.S. Pat. No. 3,940,760 referred to above. The voltage reference 76 includes suitable circuitry comparable to that described in said patent, to produce such proportional current variation with temperature.

The voltage reference 76 also incorporates circuit arrangements to ensure that the currents developed in the DAC output by the transistor current sources 32A, 32B, etc., remain substantially constant in the face of changes in ambient temperature and supply voltage. Turning now to this voltage reference circuit in more detail, the Zener diode D402 is shown with two cathodes which indicate a force and sense, or Kelvin connection to the junctions making up the diode. (For purposes of understanding the circuit operation, these two cathodes can be considered as a single connection point, and as a practical matter the circuit is operable as described with the two lines from resistors R429 and R430 joined.) As the diode D402 goes into breakdown and begins to conduct, current flows in R430, and the upper end of R430 (and the left end of R429) goes positive until Q362 turns on due to the positive base-emitter voltage of Q362 across R430. Thus, the voltage at the top of diode D402 is stabilized at a voltage which is the sum of the $V_{BE}$ of Q362 and $V_Z$ for D402, plus a small voltage across R429 which will be discussed subsequently.

The voltage at the top of the Zener diode D402 is applied through a resistor R432 to the voltage reference output which is connected to the base line 78 of the D/A converter (DAC) previously described. This voltage reference biases the R-2R ladder network, including resistors R453, R455, R456, etc., so as to produce the binary weighted currents at the converter output. The bias voltage is automatically controlled, as will be explained, so as to stabilize the binary weighted currents against the effects of changes in temperature and supply voltage.

One of the problems to be dealt with is the effect of the changes in voltage of the Zener diode D402 with changes in temperature. An important element of the solution to that problem is provided by resistor R432 and associated circuitry. More particularly, it will be seen that the PTAT current for the interbase resistors R457, R477, etc., also passes through resistor R432 to develop a voltage drop which varies directly with temperature, i.e. having a positive temperature coefficient (T.C.). Since this resistive voltage drop is subtractive with respect to the voltage of the Zener diode D402, changes in the resistive voltage drop with temperature serve to compensate for the inherent positive T.C. of the Zener voltage.

Good compensation can be effected by selecting the value of resistor R432 and the characteristics of the PTAT current source such that the slope of the PTAT resistive voltage drop closely matches that of the Zener voltage source, so that the resistive drop changes compensate for changes in the source voltage. This result can particularly be achieved by laser-trimming of resistor R432 to the correct value. Alternatively, the resistor can be trimmed to compensate not only the voltage source, but also any other uncompensated temperature-responsive variations in output remaining after all other compensations have been effected, such as will be described.

Figure 5:
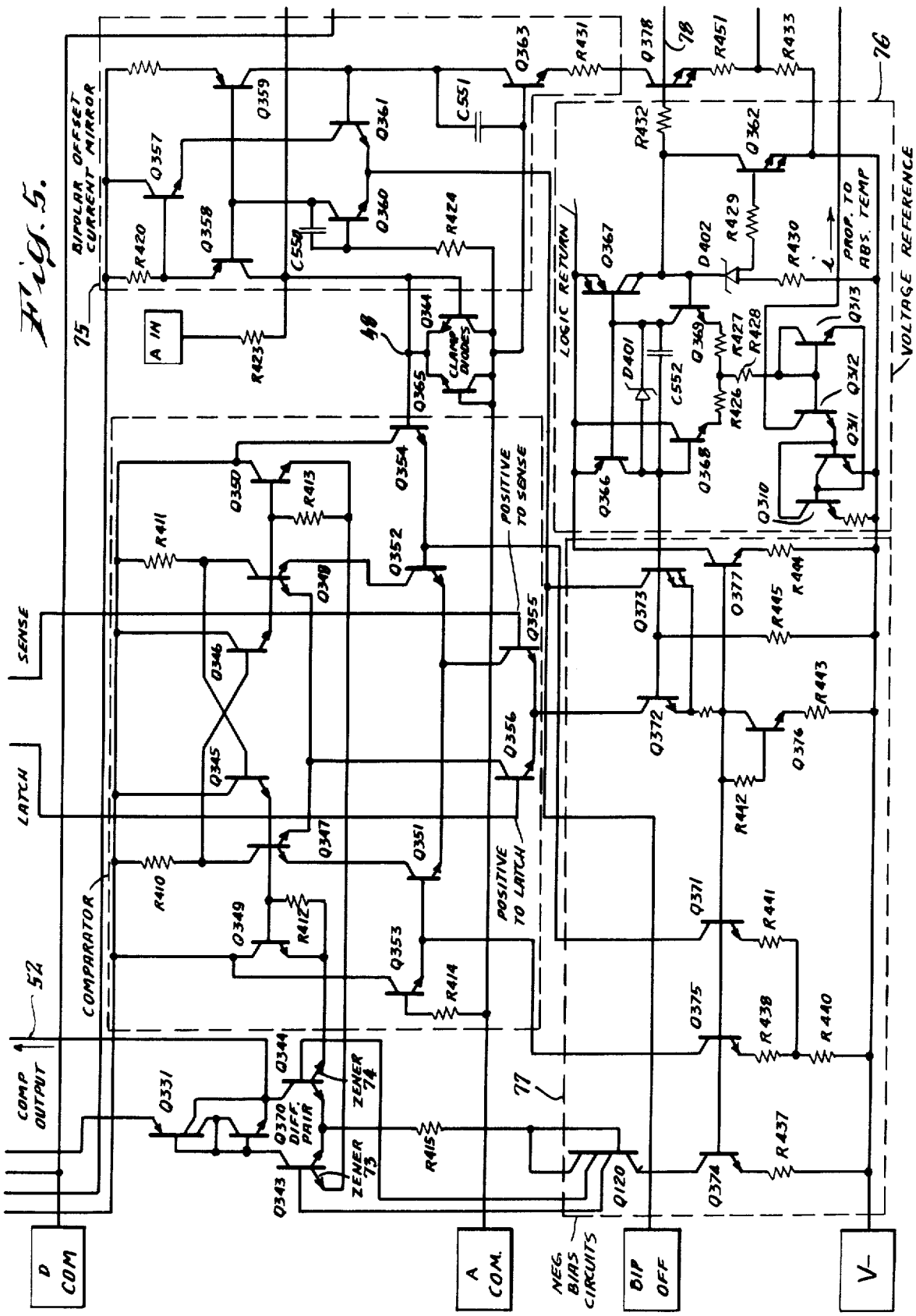
Figure 6:
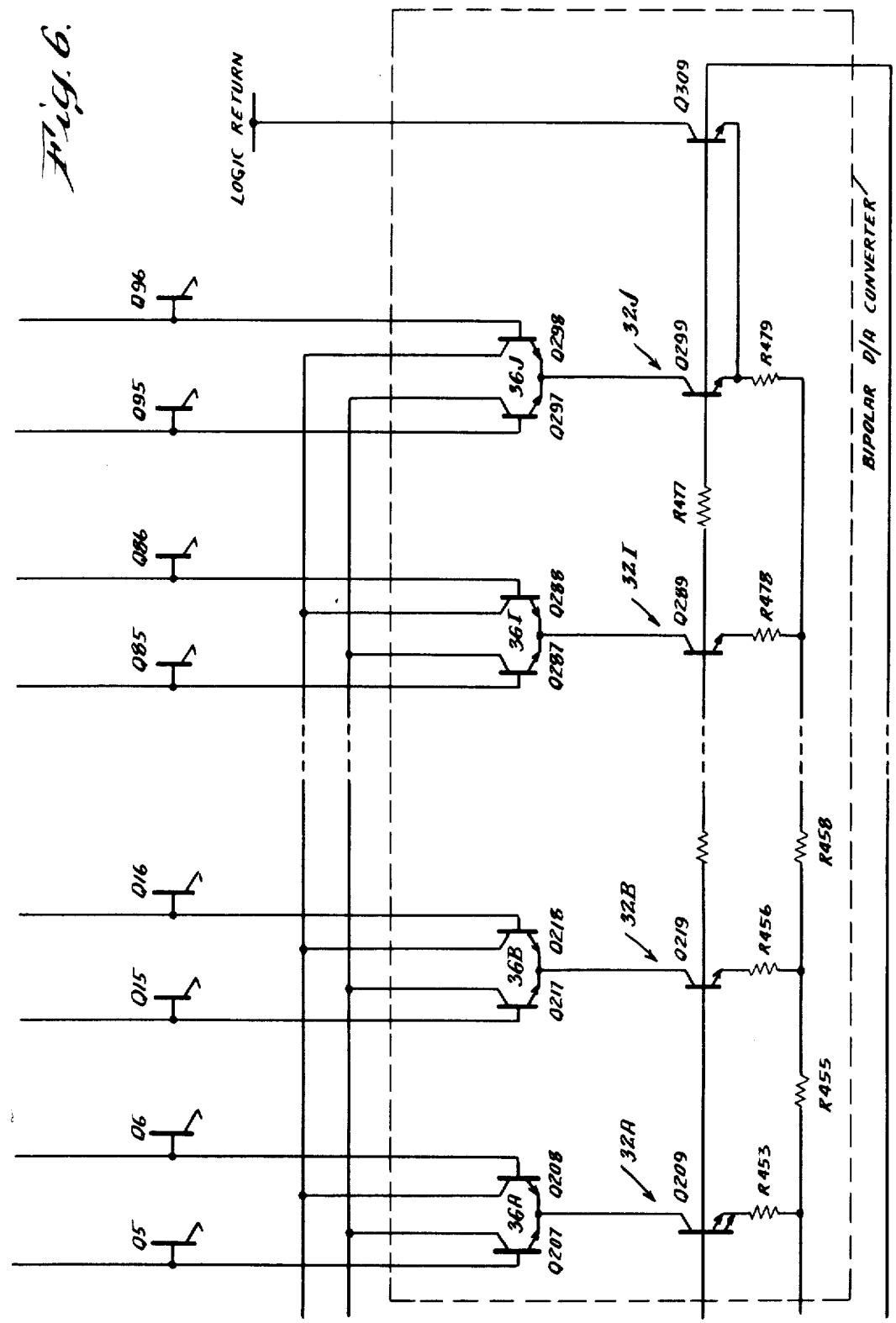

Turning now to such other compensations, a further problem is presented by the fact that there are changes with temperature of the $V_{BE}$ of Q378 and the other current source transistors which terminate the R-2R ladder. Such $V_{BE}$ changes effectively alter the bias voltage on the R-2R ladder, and thereby correspondingly tend to alter the bit currents in the DAC output. To correct for this, the cathode of the diode D402 is connected through a transistor Q362 to V- (i.e. the negative terminal of the reference supply) so that the voltage at the top of the diode contains the $V_{BE}$ of Q362. Thus, as the $V_{BE}$ of Q378 (and the other current source transistors changes with temperature, the corresponding change in the $V_{BE}$ of Q362 will alter the voltage at the top of the diode D402 to provide compensation. By arranging the transistors Q362 and Q378 to have at least approximately equal current densities (such as by use of the same number of emitters), and preferably equal densities, this compensation can be made suitably exact, thereby to maintain a constant bias voltage on the R-2R ladder in face of changes in temperature. Since the voltages at all of the other DAC transistor current source emitters are arranged to be equal to the emitter voltage of Q378, the voltage on the entire ladder is stabilized against the effects of temperature on $V_{BE}$. Such equal emitter voltages can be achieved in various ways, such as by using current sources with equal current densities (e.g., as with Q378 and Q209), or by using interbase resistors as shown in FIG. 5, and described in U.S. Pat. No. 3,940,760 previously referred to herein.

To further improve the results with the compensation arrangement just described, the current in Q362 preferably is stabilized by associated circuitry to be at least approximately constant. In the present embodiment, this circuitry serves to make the current in Q367 at least approximately constant, and to provide that the current in R430 complements that in R432, i.e. such that an increase in current through R432 is accompanied by a commensurate decrease in current through R430. In this way, the sum of the PTAT current through R432 and the current in R430 will remain at least approximately constant, thereby leaving a constant remainder of such constant current from Q367 to pass through Q362. In the present embodiment, this result is enhanced by arranging the circuit so that the resistance of R430 times the sum of the currents through R430 and R432 is at least approximately equal to the bandgap voltage of the material.

The current through Q367 is stabilized by an amplifier including Q368 and Q369. These transistors drive the bases of Q366 and Q367 so that the Q366 current through resistor R445 will produce at the base of Q368 a voltage equal to the voltage at the top of the Zener diode D402. Since Q367 parallels Q366 and has twice the emitter area, it puts out twice the amount of current into the Zener circuitry previously described. Since the Zener diode D402 has an inherent positive T.C., and the $V_{BE}$ of Q362 has an inherent negative T.C., the voltage at the top of the diode D402 is (approximately) temperature-compensated. Consequently, since the voltage across R445 is driven by the current from Q366 to match the Zener diode voltage, the current from Q366 (and the corresponding current from Q367) is in turn temperature-compensated.

The output impedance of Zener diode D402 coupled with Q362 is very low and the impedance of Q367 is high, so that the resulting bias circuit is quite insensitive to supply voltage variation.

Resistor R429 between diode D402 and Q362 provides an additional temperature compensation effect. The base current of Q362 flows in R429 and produces a voltage drop inversely proportional to $\beta$. This additional drop is translated to the top of the diode D402 to appear ultimately across the R-2R ladder, resulting in a slight increase in each of the DAC bit currents. Changes in the voltage drop across R429 with temperature tend to compensate for changes in the DAC output current due to changes in $\beta$ of the current source transistors with temperature.

In more detail, of the binary weighted currents in the DAC, it will be seen that a small fraction is diverted away from the output due to the base current of Q378 and the other transistors terminating the ladder through Q309. Still other current is lost due to the base currents of Q208, Q218, etc., serving as the current source switches. This diverted current is a function of $\beta$ and therefore varies with temperature. The changes in ladder voltage due to the variation in base current through R429 tend to compensate for these changes in such diverted current, and, since both changes are $\beta$-related, they will track in proper proportion. By selecting the value of R429, the additional voltage drop produced across the ladder will add a current to each ladder output which equals the amount lost to base currents in the DAC control and switch transistors.

Accordingly, it will be understood that the reference-voltage apparatus disclosed in FIG. 5 of the drawings serves to bias a current-output DAC directly from a Zener diode without the need for an intervening amplifier. The compensation and bias circuits are arranged to produce a stable voltage directly across the binary weighted network, and a further compensation is provided for base currents.

BIASING

In addition to generating the various bias currents and voltages used in the converter, and mentioned elsewhere, the biasing of the I²L circuitry is specially arranged to take maximum advantage of existing bias levels and to avoid the need for level translator structures. The I²L circuitry is connected so that the injector R, which is its most positive power terminal, is driven from a bias voltage which is negative with respect to ground. This low impedance bias is generated by the forward conducting voltage drops of Q323 and Q324 acting as diodes. The switches 36A, 36B, . . . etc., must be negative with respect to ground in order to drive the summing point 48 of the comparator 50 so as to converge toward ground potential. The negative bias voltage of the successive-approximation control 42 permits it to directly drive the switches without voltage level translators, which would be required using conventional logic power voltages.

Moreover, because it is the positive power connection to the successive-approximation control logic 42 which operates at fixed voltage (two diode-drops below ground), the I²L circuitry can be powered in part by currents derived from operation of the Zener supply voltage source 76 and the DAC circuits. This current is used by these circuits, which approximately regulate its amplitude, and they have sufficient voltage compliance to permit them to be connected to the negative side of the logic. In this way these currents are used to power the I²L transistor circuitry as they are returned to ground. This permits a saving of overall power over the conventional approach wherein the negative power connection is fixed by a low impedance connection and additional fixed current would be used to power the positive logic connection.

The negatively biased I²L circuitry must drive the output buffers 56A, 56B, . . . etc., which are biased between ground and the positive supply for compatibility with external circuitry. Connection between the I²L logic and the buffers is accomplished by driving a single inverted mode NPN collector which has sufficient voltage compliance to accommodate the difference in bias voltage levels. This represents no increase in complexity over a conventional biasing arrangement.

Figure 8:
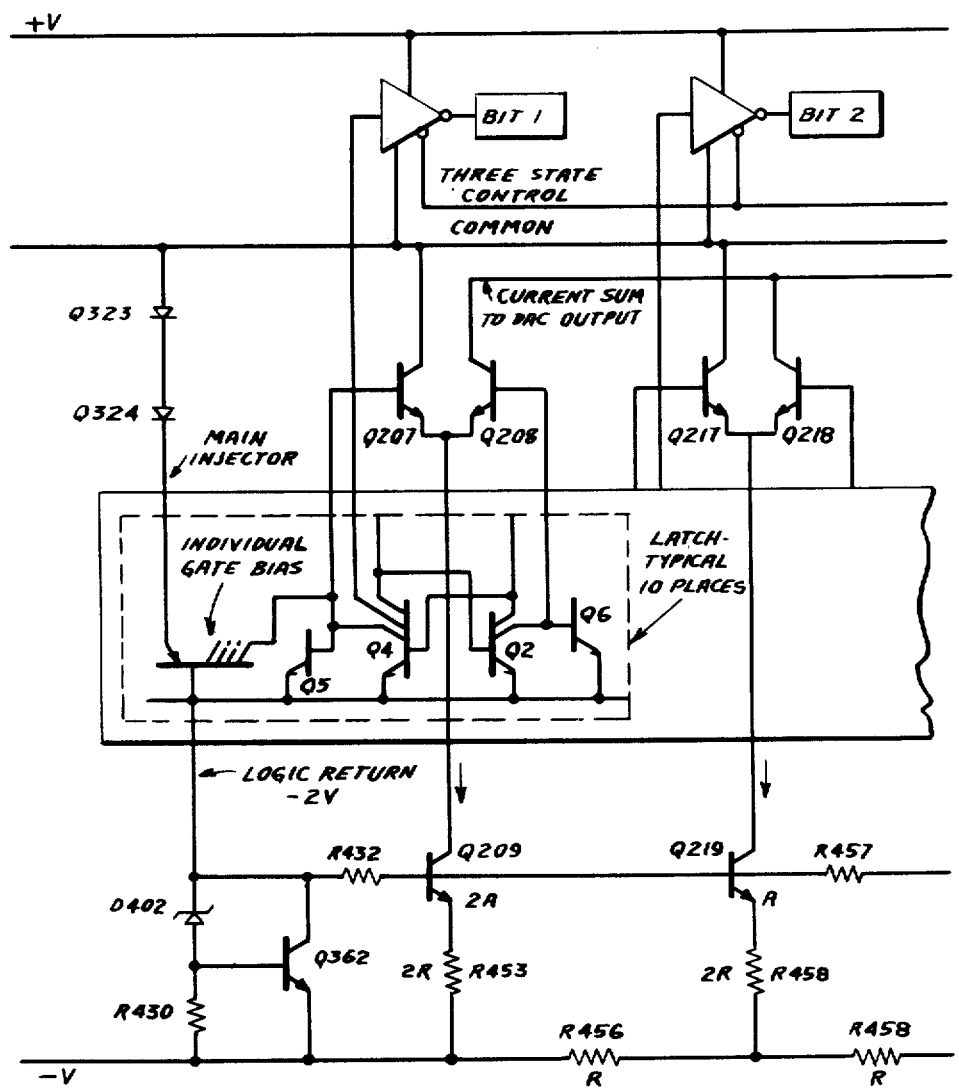
FIG. 8 is a simplified schematic illustrating the I$^2$L/-linear interface for two-bits of the DAC.

The inventive aspects described immediately above can perhaps be better understood through reference to the simplified schematic of FIG. 8 illustrating the I²L/-linear interface for two bits of the converter. This schematic shows how the I²L logic directly drives the differential switches (Q207, Q208, etc.) in the DAC, thereby eliminating the buffers usually required between such elements. The switches are supplied by respective current sources (Q209, Q219) which terminate the R-2R ladder producing the binary weighted currents. The low voltage swings of the I²L are ideal to drive the NPN differential switches which divert the binary weighted currents either to the DAC output or the digital common line.

Since the DAC output is driven to a null around analog common, the differential switches are negative with respect to analog common. The logic array is biased negatively by the diodes Q323, Q324 so that the logic level is appropriate for driving the switches. This level also allows the I²L collectors to directly drive the 3-state digital output gates. The negative currents activating the buried Zener reference diode D402 are re-used to provide power to the I²L logic array.

Contrary to standard practice, in the disclosed embodiment the I²L logic is powered from a fixed positive voltage (specifically, as shown, two diode drops below ground) and driven by a negative current. This negative current is that used first by the voltage-reference circuitry, plus a small amount of current derived from Q377, shown in FIG. 5. (Use of the latter transistor is however not a requirement.) It particularly is important to note that this biasing arrangement is a reversal of the usual practice which is to ground the negative terminal of the I²L elements and supply operating current to the positive terminal.

Although a preferred embodiment of the invention has been described herein in detail, it is desired to emphasize that this is for the purpose of illustrating the principles of the invention, and should not necessarily be construed as limiting of the invention since it is apparent that those skilled in this art can make many modified arrangements of the invention without departing from the true scope thereof.

We claim:

1. An integrated circuit analog-to-digital converter wherein an analog input signal is compared to an internally derived signal comprising:
   internal signal-deriving means including normal mode transistors connected in said converter so as to be negative with respect to ground;
   digital control means including inverted-mode transistors for controlling said signal-deriving means;
   biasing means for said digital control means arranged to provide that said digital control means is negative with respect to ground;
   means providing a signal which is positive with respect to ground for controlling the operation of said digital control means; and
   circuit means establishing direct interconnection between said digital control means and said signal-deriving means without the interposition of level translators therebetween.

2. An integrated circuit analog-to-digital converter comprising:
   substrate means having transistors and associated circuitry diffused therein;
   d-c power supply bus means for said substrate means and comprising a negative voltage bus, and a ground common bus;
   said transistors including a set of inverted mode transistors arranged as a successive-approximation control means and register means;
   said transistors further comprising current source means including a set of normal mode transistors serving as switch-controllable current sources;
   normal mode transistor switch means coupled to said successive-approximation control means for controlling said current sources so as to produce summation currents for comparison with an analog input signal whereby to determine the digital signals to be stored in said register means;
   first circuit means coupling said inverted mode transistors between said common bus and said negative bus to supply power thereto and arranged to operate said inverted mode transistors in a first voltage range;
   second circuit means coupling said normal mode transistors between said common bus and said negative bus to supply power thereto and arranged to operate said normal mode transistors in a second voltage range which is negative relative to said first voltage range; and
   third circuit means interconnecting said switch means with said set of normal mode transistors to provide control of the individual current sources in accordance with the operation of said successive-approximation control means and register means;
   the negative supply voltage for the successive-approximation control means permitting it to directly drive said switch means without the need for voltage level translators.

3. A converter as in claim 2, wherein said normal mode transistors include a group of transistors arranged as individual switch circuits for respective current sources;
   said inverted mode transistors including a group connected directly to said switch circuit transistors to operate said switch circuits selectively in accordance with the algorithm of said successive-approximation control means.

4. An analog-to-digital converter comprising a single monolithic chip formed with:
   a plurality of normal mode transistor current sources arranged to produce respective currents for summation into a composite signal;
   I²L inverted mode transistor means including logic circuitry means defining successive-approximation control means arranged to carry out a successive-approximation algorithm; and
   normal mode transistor switch means responsive to said successive-approximation control means and serving to selectively control the outputs of said current sources to carry out said algorithm for developing a digital output corresponding to an unknown analog signal;
   power supply means comprising a ground terminal and a negative terminal; and circuit means interconnecting both said I²L transistor means and said normal mode transistors between said ground terminal and said negative terminal to supply operating current thereto.

5. A converter as in claim 4, wherein said normal mode current source transistors are operated in a potential range which is more negative than the potential range of said inverted mode transistors.

6. A converter as in claim 5, wherein the injector voltage for said inverted mode transistors is fixed; and means for supplying a negative current to the negative terminal of said logic circuit means.

7. An analog-to-digital converter comprising a single monolithic chip formed with:
 a plurality of normal mode transistor current sources arranged to produce respective currents for summation into a composite signal;
 I²L inverted mode transistor means including logic circuit means defining successive-approximation control means arranged to carry out a successive-approximation algorithm;
 power supply means comprising first and second terminals providing first and second potentials of fixed magnitudes with said second potential being less positive than said first potential;
 a current supply circuit comprising normal mode transistors;
 first circuit means coupling the negative-voltage side of said inverted mode transistors to the positive-voltage side of said current supply circuit transistors, in a common series connection therebetween;
 second circuit means coupling the positive-voltage side of said inverted mode transistors to said first terminal to establish the positive side of said logic circuit means at a fixed potential;
 and
 third circuit means coupling the negative-voltage side of said current supply circuit transistors to said second terminal, whereby negative current flows from said second terminal through said current supply circuit transistors, said common series connection, and said inverted mode transistors.

8. A converter as in claim 7, wherein said first terminal establishes a potential no more positive than a common ground potential, and said second terminal provides a negative supply voltage.

9. A converter as in claim 7, including a group of normal mode transistors arranged as individual switch circuits for respective current sources;
 said inverted mode transistors including a group of individual transistors which are connected directly to respective switch circuit transistors to operate said switch circuits selectively in accordance with the algorithm of said successive-approximation control means.

10. A converter as in claim 9, including a second set of normal mode transistors arranged as output buffers;
 a third terminal providing a positive supply voltage; and
 means coupling said output buffers between said third terminal and said first terminal.

11. An analog-to-digital converter comprising a single monolithic chip formed with:
 a plurality of normal mode transistor current sources arranged to produce respective currents for summation into a composite signal;
 I²L inverted mode transistor means including logic circuit means defining successive-approximation control means arranged to carry out a successive-approximation algorithm;
 switch means responsive to said successive-approximation control means and serving to selectively control the outputs of said current sources to carry out said algorithm for developing a digital output corresponding to an unknown analog signal;
 said inverted mode transistors and said normal mode current source transistors all being operated in a below-ground potential range with said current source transistors being operated in a range which is more negative than the potential range of said inverted mode transistors;
 means fixing the injector voltage for said inverted mode transistors; and
 means for supplying a negative current to the negative terminal of said logic circuit means;
 said means for supplying negative current comprising means connecting said negative logic terminal to the positive voltage side of a circuit comprising normal mode transistors, whereby the negative current flowing through said normal mode transistor circuit also flows through said inverted mode transistors.

12. An analog-to-digital converter comprising a single monolithic chip having both analog circuits and digital circuits for processing an analog input signal to a corresponding digital output signal, said chip comprising:
 normal-mode transistor means forming part of said analog circuits and including a set of current sources for producing an internally derived-signal for comparison with the analog input signal;
 switch means for controlling said current sources;
 I²L inverted-mode transistor means forming part of said digital circuits and including switch control transistors coupled to said switch means without the interposition of level-translating means therebetween;
 said I²L inverted-mode transistor means further comprising logic means for activating said switch control transistors to carry out a conversion algorithm;
 power supply means comprising a pair of terminals, one of said terminals being at ground potential and the other being negative with respect to ground;
 means providing a signal which is positive with respect to ground for controlling the operation of said logic means; and
 circuit means interconnecting said I²L transistor means and said normal mode transistor means between said power supply terminals to supply operating current to both of said transistor means while maintaining both in a below ground voltage range.

13. A converter as in claim 12, wherein at least cetain of said normal mode transistor means are operated in a potential range which is more negative than the potential range of said inverted-mode transistor means.

14. A converter as in claim 12, wherein the I²L transistor means includes clock means for producing clock signals for said logic means.

15. An analog-to-digital converter comprising an integrated circuit chip, the combination of:
 analog circuitry comprising a first group of normal-mode transistors and an output terminal;
 said normal-mode transistors each having first and second main electrodes;

first power supply terminal means connected to said normal-mode transistors to supply operating current through the main electrodes thereof;

said first group of transistors having first circuit means operable therewith to control the flow of current through the main electrodes of one of said normal-mode transistors;

means coupling said one transistor to said output terminal to develop thereon an output signal variable in accordance with changes in the flow of current through said one transistor;

said analog circuitry including a second group of normal mode transistors including a set of switchable current sources;

said output signal being coupled to said second group of normal mode transistors to provide a control signal for controlling the functioning thereof in accordance with said output signal;

$I^2L$ inverted mode transistors forming logic circuitry producing a digital output signal to control the switching of said set of current sources;

second power supply terminal means for said inverted mode transistors;

voltage supply means; and means connecting said first and second power supply terminal means serially with said voltage supply means to provide that current flowing through and used in the operation of said first group of normal mode transistors is used also to power said $I^2L$ logic circuitry.

16. A converter as in claim 15, wherein said first group of normal-mode transistors operates with said first circuit means to provide a reference voltage of said current sources.

17. A converter as in claim 15, wherein said voltage supply means energizes said $I^2L$ logic circuitry and said normal-mode transistors at potentials which are below-ground.

18. An intergrated circuit analog-to-digital converter comprising:

substrate means having transistors and associated circuitry diffused therein;

d-c power supply bus means for said substrate means and comprising a negative voltage bus and a ground common bus;

said transistors including a set of inverted mode transistors arranged as a successive-approximation control means and register means;

means providing a positive control singal for said successive-approximation control means;

said transistors further including a set of normal mode transistors serving a switch-controllable current sources;

transistor switch means coupled to said successive-approximation control means without the interposition of level translators therebetween, said transistor switch means being operable by said successive-approximation means for controlling said current sources so as to produce summation currents for comparison with an analog input signal, whereby to determine the digital signals to be stored in said register means; and circuit means coupling said sets of transistors between said common bus and said negative bus to supply operating power thereto.

19. A converter as in claim 18, including a second set of normal mode transistors arranged as output buffers; a positive supply bus;

said circuit means including means coupling said output buffers between said positive supply bus and said common bus, to furnish operating power to said buffers.

* * * * *